United States Patent [19]
Foster et al.

[11] Patent Number: 5,217,053
[45] Date of Patent: Jun. 8, 1993

[54] VENTED VACUUM SEMICONDUCTOR WAFER CASSETTE

[75] Inventors: Leonard W. Foster, Richardson; Edwin G. Millis, Dallas, both of Tex.

[73] Assignee: Texas Instruments Incorporated, Dallas, Tex.

[21] Appl. No.: 885,109

[22] Filed: May 18, 1992

Related U.S. Application Data

[62] Division of Ser. No. 475,556, Feb. 5, 1990, Pat. No. 5,137,063.

[51] Int. Cl.$^5$ ............................................. H05K 1/00
[52] U.S. Cl. ...................................... 141/98; 141/286; 141/302; 414/217; 250/441.11; 206/334; 206/524.8
[58] Field of Search ............... 141/65, 66, 85, 98, 141/286, 302, 383, 386; 414/217, 221, 292; 250/441.11, 492.21; 206/328, 334, 454, 455, 524.8

[56] References Cited

U.S. PATENT DOCUMENTS

| | | |
|---|---|---|
| 3,943,987 | 3/1976 | Rossi .............................. 206/524.8 |
| 3,949,891 | 4/1976 | Butler et al. ..................... 206/334 X |
| 4,027,707 | 6/1977 | Maskell ................................ 141/66 |
| 4,066,401 | 1/1978 | Solomon .......................... 206/524.8 |
| 4,181,161 | 1/1980 | Kraus ................................ 141/65 X |
| 4,616,683 | 10/1986 | Tullis et al. ........................ 141/98 |
| 4,724,874 | 2/1988 | Parikh et al. ....................... 141/98 |
| 4,739,882 | 4/1988 | Parikh et al. ...................... 206/454 |
| 4,797,054 | 1/1989 | Arii ................................. 414/217 |
| 4,969,556 | 11/1990 | Ishimaru et al. ................. 206/524.8 |
| 4,987,933 | 1/1991 | Mack ............................ 250/441.11 X |

FOREIGN PATENT DOCUMENTS

| | | |
|---|---|---|
| 0111469 | of 1898 | Fed. Rep. of Germany ........ 141/85 |
| 2282087 | 11/1990 | Japan ................................ 206/334 |
| 0398878 | 4/1991 | Japan ............................ 206/524.8 |

Primary Examiner—Henry J. Recla
Assistant Examiner—Casey Jacyna
Attorney, Agent, or Firm—W. James Brady, III; B. Peter Barndt; Richard L. Donaldson

[57] ABSTRACT

A vacuum storage cassette for semiconductor wafers has one or more valves to allow the cassette to be evacuated, backfilled, and opened to the surround atmosphere and resealed without the need for a vacuum load-lock chamber.

10 Claims, 4 Drawing Sheets

VENTED VACUUM SEMICONDUCTOR WAFER CASSETTE

This is a division of application Ser. No. 07/475,556, filed Feb. 5, 1990, now U.S. Pat. No. 5,137,063.

FIELD OF THE INVENTION

This invention relates to vacuum cassettes used for storing semiconductor wafers during production, and more particularly to a vacuum cassette that can be opened and resealed without the need for a vacuum load-lock chamber.

BACKGROUND OF THE INVENTION

The vacuum cassette in present use is a sealed container with a door providing access to the semiconductor wafers. When the cassette is in its normal operating mode with a vacuum within, the door cannot be opened to remove or load wafers. In the case of interfacing the vacuum cassette with a vacuum semiconductor processing system (vacuum processing system), the cassette is loaded into a vacuum load-lock interface integral with the process machine. This load lock is sealed and pumped down to a vacuum approximately the same as is inside the cassette, and the cassette door is then opened.

A gate valve in the load-lock is then opened and the wafers moved to and from the vacuum cassette to the interior of the vacuum processor as required. The wafers remain in a vacuum throughout the processing steps. When the wafer movement is complete, the gate valve and the cassette door are closed, and the load-lock is backfilled to ambient pressure with clean gas, usually air. The load-lock door can then be opened and the vacuum cassette removed. The interior of the vacuum processor remains in a vacuum throughout the process.

The above process is done automatically after the introduction of the vacuum cassette into the load-lock chamber. Vacuum gages are installed in appropriate locations to monitor the load-lock and process chamber conditions as required by a process sequencer/controller.

If it is desired to interface the vacuum cassette to a process that is not done in a vacuum, or if there is a circumstance where the semiconductor wafers must be at room ambient pressure, the cassette must be placed inside a vacuum load-lock chamber, which is then evacuated to a pressure comparable to the pressure inside the cassette. The cassette door may then be opened and the chamber and cassette backfilled with an appropriate atmosphere, usually clean air, to ambient pressure. Then the load-lock chamber may be opened, either with a gate valve or the loading door, and the wafers removed from or loaded into the open cassette.

BRIEF SUMMARY OF THE INVENTION

The invention relates to a vacuum chamber with one or more valves and ports which will allow the cassette to be evacuated, backfilled and opened to the surrounding atmosphere without the need for a vacuum load-lock chamber. In use, the vacuum cassette is locked into a fixture or cradle which automatically provides a sealed connection to the cassette port or ports, and mechanical or electromechanical connections to actuate the cassette mechanical or electrical valve or valves. The valves are opened and the vacuum backfilled at a predetermined rate with the appropriate atmosphere through the cassette port connection. When the internal pressure of the cassette is equal to the ambient pressure, as indicated by one or more vacuum/pressure gages, the cassette door may be opened and the semiconductor wafers removed or introduced without the use of a vacuum lock-load chamber.

When the wafer handling has been completed, the door of the vacuum cassette is closed and the cassette is pumped down to the desired level of vacuum, as indicated by the system vacuum/pressure gage, at a predetermined rate through the ports and valves.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT OF THE INVENTION

Figure 1:
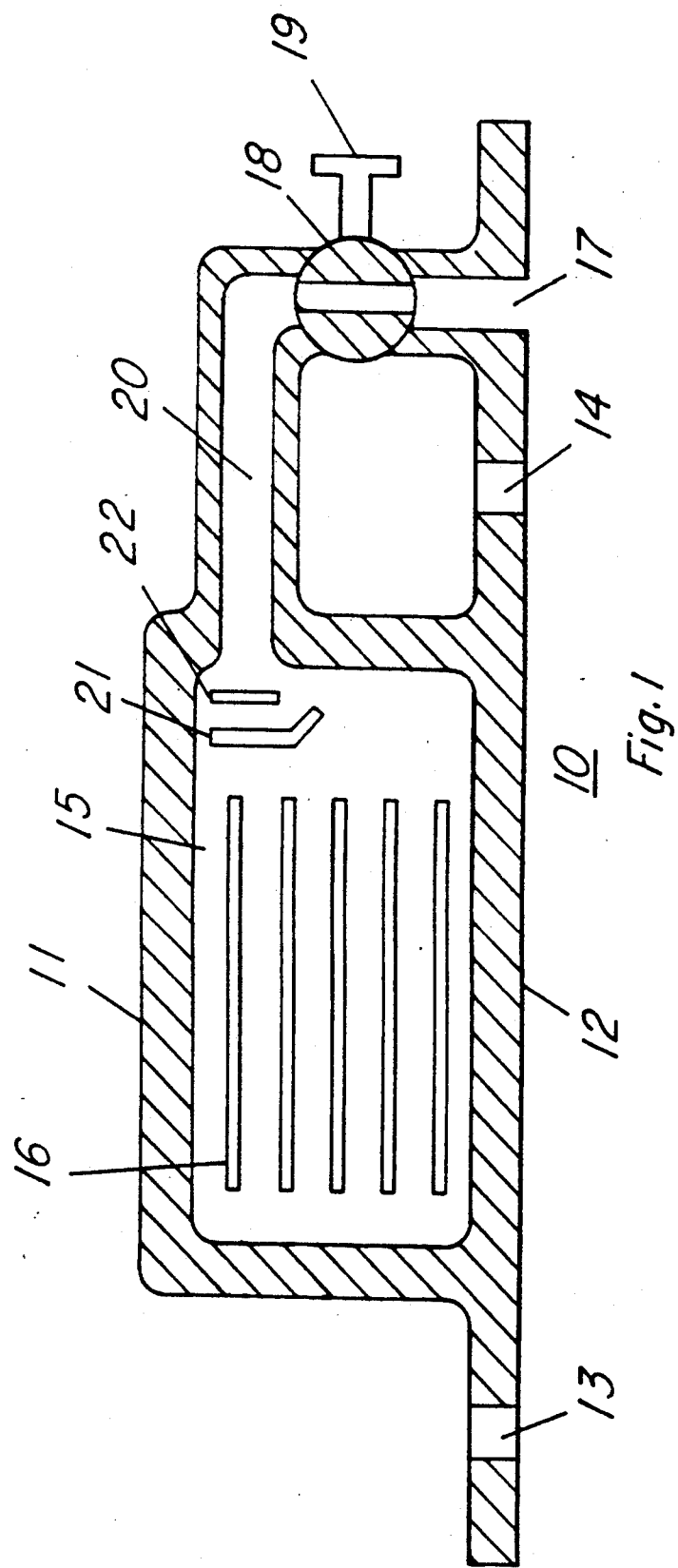
FIG. 1 illustrates a cross sectional view of a vacuum cassette with a single port.

FIG. 1 is one embodiment of the invention. Cassette 10 has a chamber 11 with base 12. Cassette 10 is positioned on a work station using pins that extend through openings 13 and 14. The cassette chamber 15 is evacuated or filled with gas through channel 20, valve 18 and port 17. Valve 18 is opened or closed by a value actuator (not illustrated) coupled to valve lever 19. Chamber 15 has two baffles 21 and 22 positioned at the chamber end of channel 20 to evenly distribute gases input to the chamber. Semiconductor wafers 16 are shown spaced apart in the vacuum chamber.

Figure 2:
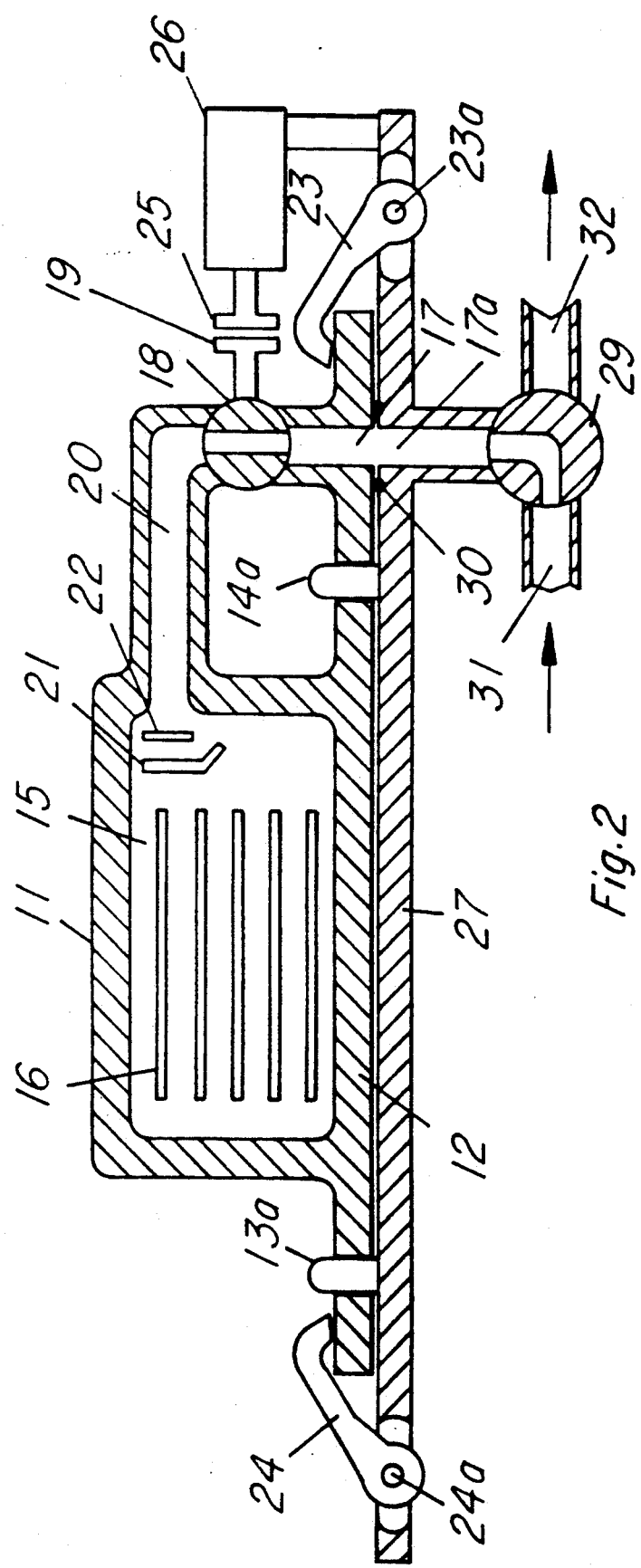
FIG. 2 illustrates the vacuum cassette of FIG. 1 positioned at a work station.

FIG. 2 illustrates the vacuum cassette of FIG. 1 mounted and secured to a work station. As illustrated, the vacuum cassette and valve position are in a backfill mode.

The cassette is mounted on a work surface 27 and secured to the work surface with hold-down clamps 23 and 24. Hold-down clamps 23 and 24 pivot around a pin 23a (clamp 23) and pin 24a (clamp 24) to hold the base of the vacuum cassette down against the work surface 27. Pins 13a and 14a position the cassette such that port 17 of the cassette matches port 17a of the gas/vacuum line.

The interface between openings 17 and 17a is sealed by Q-ring 30 so that when a vacuum is being pulled, or gas is introduced into the vacuum cassette, there will be no leakage from outside the cassette at the interface at 17 and 17a.

Valve 18 is actuated by valve actuator 26. Actuator 26 is coupled to valve 18 by actuator lever 25 and valve lever 19. Valve 18 is shown in the open position.

A rotary or other type valve 29 is used to open and close line 17a which connects the vacuum cassette 11 to a vacuum pump at 32 or to a source of backfill gas at 31. As illustrated in FIG. 2, the rotary valve is shown in the gas backfill position.

Operation of the vacuum cassette illustrated in FIG. 2 is as follows.

Cassette 11 is secured to a work surface 27 with clamps 23 and 24. The port at 17 is sealed with O-ring 30 against the work surface 27. The cassette is then backfilled with a gas through line 31, rotary valve 29, port 17, and cassette valve 18. Once the cassette is backfilled and the pressure inside the cassette approximates the atmospheric pressure outside the cassette, the cassette may be opened (the door to the cassette is not illustrated), the semiconductor wafers 16 removed, and processed. After processing, the semiconductor wafers are returned to the cassette, and the cassette evacuated through valve 18, port 17, and rotary valve 29 to the vacuum pump through line 32.

Figure 3:
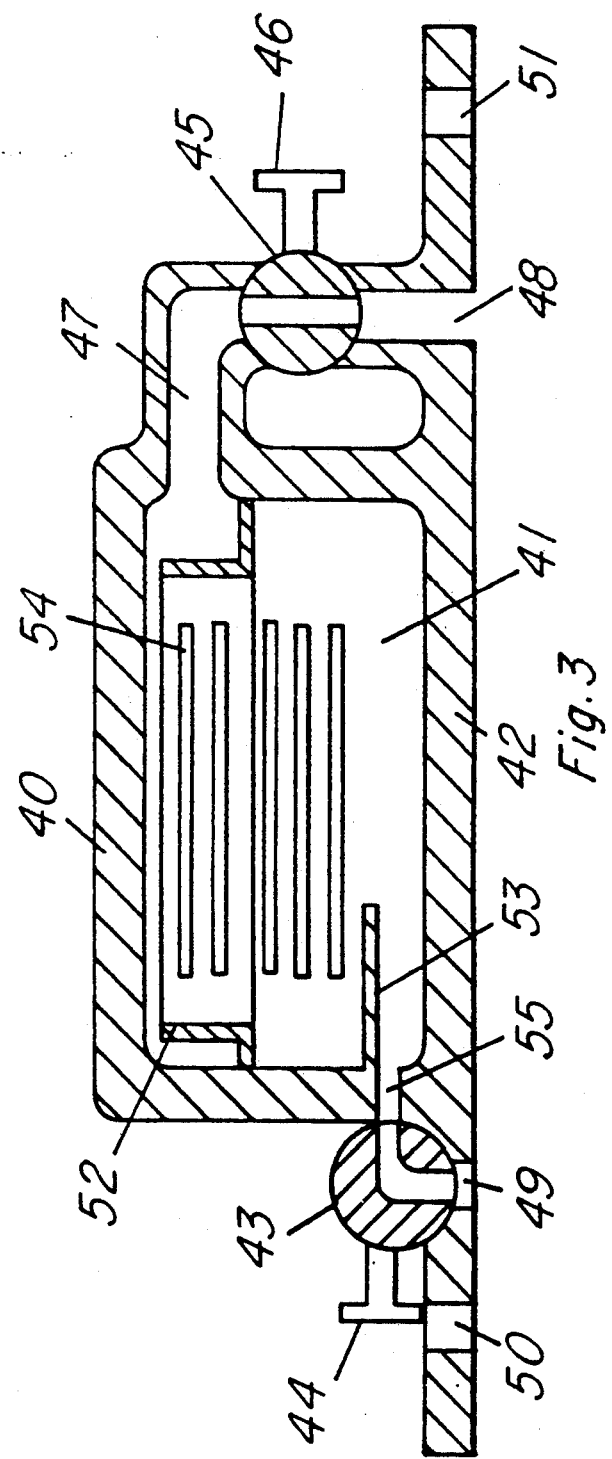
FIG. 3 illustrates a cross sectional view of a vacuum cassette with two ports.

FIG. 3 illustrates a vacuum cassette with two ports and two valves. The use of two valves and two ports allows separation of the backfill and vacuum pumpdown functions to prevent cross contamination of the semiconductor wafers. It also provides for direct purging of the interior of the vacuum cassette through the base of the vacuum cassette in the event of particle contamination.

Vacuum cassette 40 has a base 42 with alignment holes 50 and 51, and ports 48 and 49. Access to vacuum chamber 41 is through two paths: port 48, valve 45 and channel 47; and port 49, valve 43 and channel 55. Two baffles, 52 and 53, are located in chamber 41. These baffles are used to prevent direct flow of gases across the semiconductor wafers 54. Valve 45 is actuated by lever 46 and valve 43 is actuated by lever 44.

Figure 4:
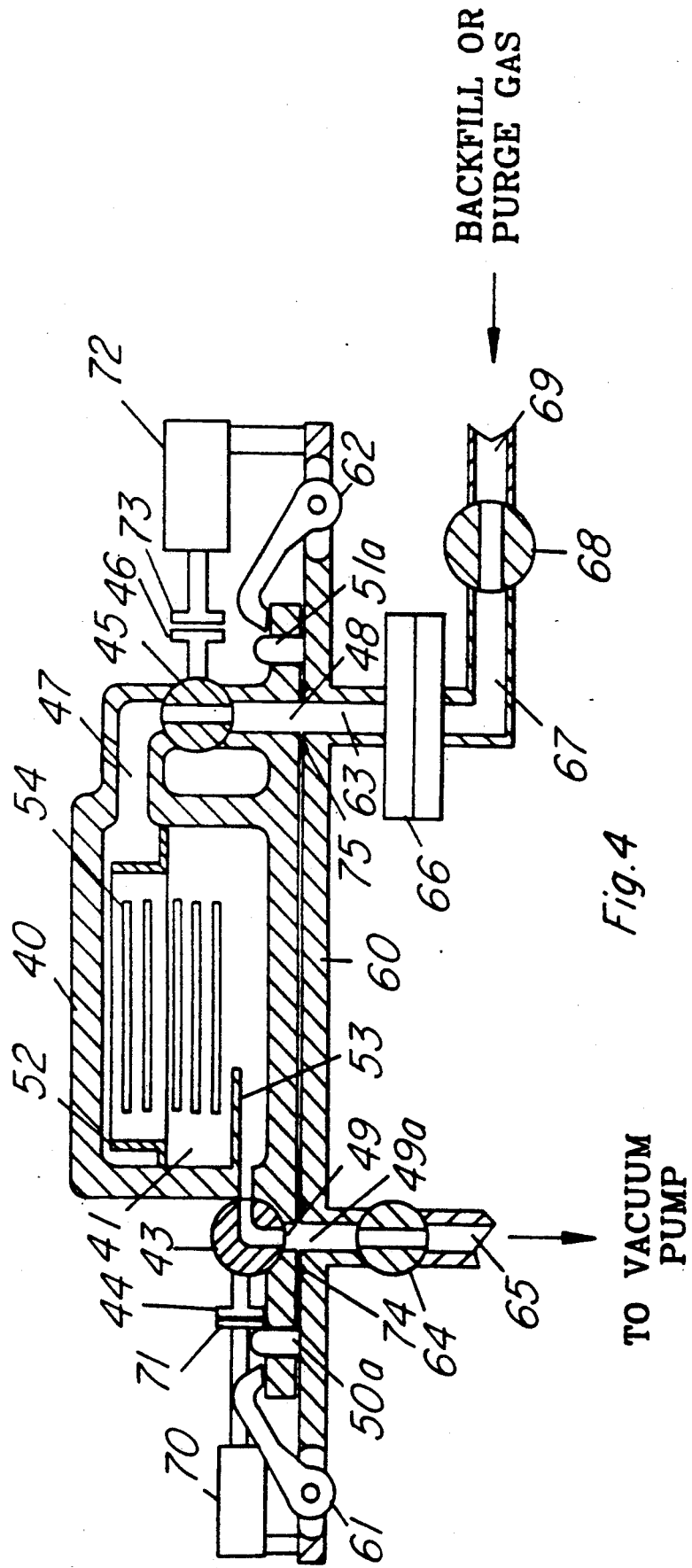
FIG. 4 illustrates the cassette of FIG. 3 positioned at a work station.

FIG. 4 shows the vacuum cassette of FIG. 3 mounted on a work surface 60 and clamped thereto with clamps 61 and 62. Vacuum cassette 40 is aligned on the work surface 60 with alignment pins 50a and 51a. Port 48 of the vacuum cassette is aligned with port 63 of the work surface and sealed thereto with O-ring 75. Port 49 of the vacuum cassette is aligned with port 49a of the work surface 60 and the two ports, 49, and 49a are sealed with O-ring 74. Valve 43 is actuated by valve actuator 70. Actuator 70 is coupled to valve 43 by actuator lever 71 and valve lever 44. Valve 45 is actuated by valve actuator 72. Actuator 72 is coupled to valve 45 by actuator lever 73 and valve lever 46.

Baffles 52 and 53 are arranged to baffle and diffuse the gas flow into and through the chamber 41. The baffle is used to minimize the particle disturbance from either backfill or pump down, and to maximize the rate of backfill and/or pump down for production considerations. Gas velocities above a critical level can introduce settled particles back into the inside environment with the possibility of wafer contamination.

The valves in FIG. 4 are shown in a purge mode. A purge gas is introduced into line 69 through valve 68, line 67, filter 66, and into the cassette through port 48, and valve 45 and channel 47. The purge gas flows into cassette chamber 41, then out through valve 43, port 49 and through valve 64 to the vacuum pump.

To evacuate vacuum chamber 41, valve 45 is closed and the vacuum pump pulls the vacuum through valve 43, port 49 and valve 64. When the vacuum in chamber 41 is at the desired level, then valve 43 is closed.

When chamber 41 has a vacuum therein, and it is desirable to remove the vacuum so that the semiconductor wafers may be removed, valves 45 and 68 are opened and a suitable gas, commonly clean air or other gas is introduced into the chamber. Backfilling of the chamber with the clean gas brings the chamber to a pressure approximately equal to the pressure outside the cassette.

As vacuum cassettes become more common in semiconductor production, it will be important to minimize the cost of the interface with non-vacuum equipment. The vacuum cassettes and interface system described above will cost considerably less than a load-lock system.

What is claimed:

1. A semiconductor wafer storage cassette, comprising:
   a plurality of walls defining a chamber for holding semiconductor wafers, said plurality of walls having a first opening and a second opening into said chamber;
   a first channel connecting said first opening with the outside of the cassette;
   a second channel connecting said second opening with the outside of the cassette;
   a first valve in said first channel;
   a second valve in said second channel;
   a first baffle within said chamber, said first baffle adjacent and substantially perpendicular to said first opening, said first baffle located below the semiconductor wafers and extending from one of said plurality of walls; and
   a second baffle within said chamber, said second baffle adjacent said second opening, said second baffle having a first portion surrounding at least some of the semiconductor wafers and extending above the semiconductor wafers.

2. The storage cassette according to claim 1 for mounting on a work surface, including,
   alignment pin holes in the cassette for aligning the cassette on a work surface.

3. The storage cassette according to claim 1, wherein one of said valves is used in evacuating the cassette chamber.

4. The storage cassette according to claim 1, wherein one of said valves is used in backfilling the vacuum chamber with a gas.

5. A semiconductor processing system, comprising:
   a semiconductor wafer cassette, including:
   a plurality of walls defining a chamber for holding semiconductor wafers, said plurality of walls having a first opening and a second opening into said chamber;
   a first channel connecting said first opening with the outside of the cassette;
   a second channel connecting said second opening with the outside of the cassette;
   a first valve in said first channel;
   a second valve in said second channel;
   a first baffle within said chamber, said first baffle adjacent and substantially perpendicular to said first opening, said first baffle located below the semiconductor wafers and extending from one of said plurality of walls;
   a second baffle within said chamber, said second baffle adjacent said second opening, said second baffle having a first portion surrounding at least some of the semiconductor wafers and extending above the semiconductor wafers; and
   a work station, including:
   a work station mounting surface having a first opening for interfacing with said first channel and a second opening for interfacing with said second channel.

6. The semiconductor processing system of claim 5, in which one of said plurality of walls is a base for mounting on said work station mounting surface, said base having alignment holes, said work station surface including alignment pins for insertion into said alignment holes for aligning said first channel with said first opening in said work station mounting surface and said second channel with said second opening in said work station mounting surface.

7. A semiconductor processing system, comprising:
   a wafer storage cassette, including:
   a plurality of walls surrounding a chamber for containing semiconductor wafers, said plurality of walls including a base for mounting on a work surface of a work station, an upper wall, and side wall means for connecting said base and said upper wall, said base including first and second ports, said side wall means including a first opening adjacent said base and a second opening opposed to said first opening and adjacent said upper wall;
   a first channel connecting said first opening with said first port;
   a second channel connecting said second opening with said second port;
   a first valve in said first channel; and
   a second valve in said second channel.

8. The semiconductor processing system of claim 7, further including:
   a first baffle within said chamber, said first baffle adjacent and substantially perpendicular to said first opening, said first baffle located below the semiconductor wafers and extending from one of said plurality of walls; and
   a second baffle within said chamber, said second baffle adjacent said second opening, said second baffle having a first portion surrounding at least some of the semiconductor wafers and extending above the semiconductor wafers.

9. The semiconductor processing system of claim 7, further including:
   a work station having a mounting surface, said mounting surface having a first port for interfacing with said first port in said base and a second port for interfacing with said second port in said base.

10. The semiconductor processing system of claim 9, said work station further including:
    a first line connected to said first port in said mounting surface;
    a second line connected to said second port in said mounting surface;
    a third valve in said first line; and
    a fourth valve in said second line.

* * * * *